United States Patent [19]
Miyauchi et al.

[11] Patent Number: 4,951,291
[45] Date of Patent: Aug. 21, 1990

[54] SEMICONDUCTOR LASER DEVICE WITH A PROTECTIVE FILM ON THE FACETS

[75] Inventors: Nobuyuki Miyauchi, Nara; Hiroshi Hayashi, Kyoto; Saburo Yamamoto, Nara, all of Japan

[73] Assignee: Sharp Kabushiki Kaisha, Osaka, Japan

[21] Appl. No.: 336,649

[22] Filed: Apr. 7, 1989

Related U.S. Application Data

[63] Continuation of Ser. No. 225,564, Jul. 28, 1988, abandoned, which is a continuation of Ser. No. 835,562, Mar. 3, 1986, abandoned.

[30] Foreign Application Priority Data

Mar. 11, 1985 [JP] Japan .................................. 60-48961

[51] Int. Cl.$^5$ ................................................ H01S 3/19
[52] U.S. Cl. ...................................................... 372/49
[58] Field of Search ........................................... 372/49

[56] References Cited

U.S. PATENT DOCUMENTS 4,092,659  5/1978  Ettenberg .............................. 372/49
4,178,564  12/1979  Ladany et al. ........................ 372/49

FOREIGN PATENT DOCUMENTS 0118746  2/1984  European Pat. Off. .
0168165  6/1985  European Pat. Off. .

OTHER PUBLICATIONS

8106 IEEE Jnal of Quantum Electronics, vol. QE-17 (1981), Sep., No. 9, New York, U.S.A., Donald Fye, "An Optimization Procedure for the Selection of Diode Laser Facet Coatings".

Ettenberg, "A New Dielectric Facet Reflector for Semiconductor Lasers", Applied Physics Letters, 32(11), Jun. 1, 1978, pp. 724–725.

*Primary Examiner*—William L. Sikes
*Assistant Examiner*—Georgia Y. Epps
*Attorney, Agent, or Firm*—Irell & Manella

[57] ABSTRACT

A semiconductor laser device with a protective film on the facets, wherein said protective film is made of a multi-layered dielectric film composed of alternate layers consisting of at least two kinds of dielectric film, one of which is a first dielectric film of low refractive index and the other of which is a dielectric film of high refractive index, said multi-layered dielectric film which covers at least one of the facets therewith being a light-permeable film with a reflectivity of 30% or less.

3 Claims, 3 Drawing Sheets

SEMICONDUCTOR LASER DEVICE WITH A PROTECTIVE FILM ON THE FACETS

This application is a continuation of copending U.S. Ser. No. 225,564, filed 28 July 1988, which is a continuation of U.S. Ser. No. 835,562, filed 3 Mar. 1986, now abandoned.

BACKGROUND OF THE INVENTION

1. Field of the invention

This invention relates to a semiconductor laser device with a lengthened life span.

2. Description of the prior art:

Assurance of high reliability has already been reached when optical output of GaAlAs semiconductor laser devices with an oscillation wavelength, for example, in the 780 nm region, is at a low level of 5 mW or less. Such laser devices are widely used as a light source in optical information processing systems such as those used for digital audio discs, laser discs, etc. However, in recent years, semiconductor lasers with high optical output, 30 mW or more, are in great demand as a light source for writable laser discs. The most widely used method to achieve high output of semiconductor laser devices is by creating non-symmetric reflectivity of the protective films of the facets. That is, in this method, the front facet is covered with a dielectric film of low reflectivity and the back facet is covered with a dielectric film of high reflectivity, thereby improving the differential efficiency and raising the kink level. In practice, the front facet is covered with a protective film of $Al_2O_3$, $Si_2N_4$ or the like with a thickness of $\lambda/4n$ (wherein $\lambda$ is the oscillation wavelength and n is the refractive index of the film) by electron-beam vapor deposition, sputtering deposition, plasma chemical vapor deposition, etc. The back facet is covered with a protective film composed of alternate layers for a total of four layers of either $Al_2O_3$ or $Si_2N_4$, and a-Si:$H_2$ with a thickness of $\lambda/4n$ each in the same manner as in the front facet. As a result, the reflectivity of the protective film of the front is about 6%, and the reflectivity of the protective film of the back is about 90%. Thus, compared to widely used $Al_2O_3$ or $Si_2N_4$ single layer protective films with a thickness of $\lambda/2n$ which are used on both facets, the differential efficiency and the kink level are both improved two-fold or more, and the semiconductor lasers can achieve a high output power.

However, high reliability in practice is not always achieved for the reasons mentioned below: In order to observe the degree of deterioration of semiconductor laser devices with a protective film on the facets made in the above-mentioned manner, accelerated life tests were carried out at an atmospheric temperature of 50° C. on these semiconductor laser devices with the optical output fixed at 30 mW, the driving current which is indicated by the curves shown in FIG. 3(a) increases almost linearly with the driving time, and at times tends to increase rapidly with the lapse of time.

These deteriorated semiconductor laser devices were then subjected to a deterioration-analysis using the EBIC method by the inventors of the present invention, and it was found that only the striped region in the vicinity of the front facet covered with only one layer of a protective film of $Al_2O_3$ with a thickness of $\lambda/4n$ was deteriorated so that the intensity of the EBIC image at the region was weaker than that of the other region. Moreover, it was found that the back facet covered with alternate layers consisting of four layers of $Al_2O_3$ and a-Si:$H_2$ was not deteriorated. This deterioration pattern is of the same type as that of oxidation deterioration that occurs when the facets are not covered with a protective film, so that, during high output operation, the optical density of the inside of the laser devices becomes high and a large amount of current is injected thereinto, resulting in oxidation deterioration of the facet. Therefore, the formation of only one layer of a protective film on the facets cannot attain the suppression of oxidation of the facets. This tendency is also present when $Si_2N_4$ is used as the protective film. On the other hand, the inventors have found that a multi-layered film of $Al_2O_3$ and a-Si:$H_2$ is effective not only to make reflectivity high but also to suppress oxidation.

SUMMARY OF THE INVENTION

The semiconductor laser device of this invention which overcomes the above-discussed and numerous other disadvantages and deficiencies of the prior art, has a protective film on the facets, wherein said protective film is made of a multi-layered dielectric film composed of alternate layers consisting of at least two kinds of dielectric film, one of which is a first dielectric film of low refractive index and the other of which is a dielectric film of high refractive index, said multi-layered dielectric film which covers at least one of the facets therewith being a light permeable film with a reflectivity of 30% or less.

In a preferred embodiment, the first dielectric film is made of $Al_2O_3$ and the second dielectric film is made of a-Si:$H_2$.

Thus, the invention described herein makes possible the object of providing a semiconductor laser device in which the facets are covered with a specific protective film so that oxidation of the facets, especially oxidation of the front facet, can be effectively suppressed, thereby attaining the enlargement of the life span of the laser device.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
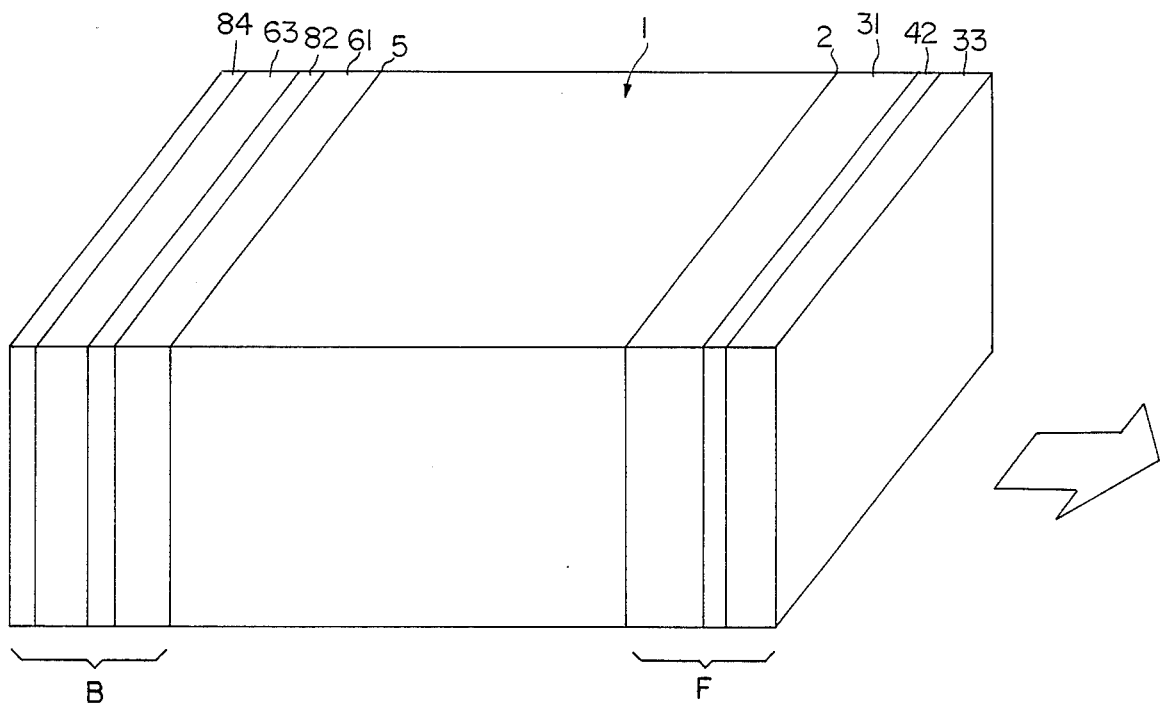
FIG. 1 is a perspective view showing a semiconductor laser device of this invention.

FIG. 1 shows a GaAlAs semiconductor laser chip 1 with an oscillation wavelength in the 780 nm region of this invention, which has multi-layered dielectric films F and B on the facets 2 and 5, respectively. The multi-layered dielectric film F is composed of alternate layers consisting two kinds of dielectric films, one of which is a first dielectric film of $Al_2O_3$ with a refractive index of 1.8 and the other of which is a second dielectric film of a-Si:H$_2$ with a refractive index of 3.9. That is, the multi-layered dielectric film F is made of three layers which are composed of the first dielectric film 31 of Al$_2$O$_3$ with a refractive index of 1.8, the second dielectric film 42 of a-Si:H$_2$ with a refractive index of 3.9, and the first dielectric film 33 of Al$_2$O$_3$ with a refractive index of 1.8, which are successively evaporated on the front facet 2 of the semiconductor laser chip 1 by sputtering deposition. The other multi-layered dielectric film B is also composed of alternate layers consisting of two kinds of dielectric film, one of which consists of the first two Al$_2$O$_3$ dielectric films 61 and 63 and the other of which consists of the second two a-Si:H$_2$ dielectric films 82 and 84. These films 61, 63, 82 and 84 are successively evaporated on the back facet 5 of the semiconductor laser chip 1 by sputtering deposition.

Figure 2A:
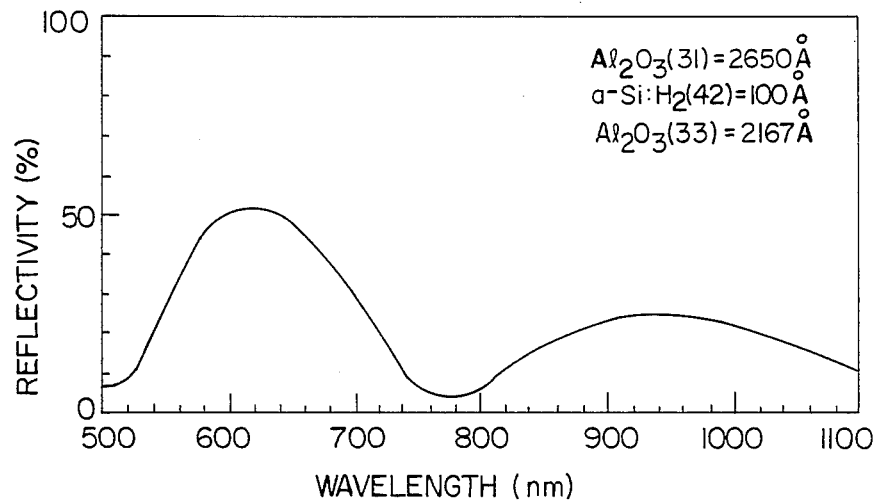
FIG. 2(a) illustrates characteristic curves showing the relationship between the wavelength of a multi-layered dielectric film on the front facet and the reflectivity of the dielectric film.

The reflectivity of each of the multi-layered dielectric films F and B is determined by the thickness of each layer. In the above-mentioned example, if the calculated reflectivity of the multi-layered dielectric film F of the front facet is to be set at about 5%, the thickness of the Al$_2$O$_3$ dielectric film 31 could be 2650 Å, the thickness of the a-Si:H$_2$ dielectric film 42 could be 100 Å, and the thickness of the Al$_2$O$_3$ dielectric film 33 could be 2167 Å. When such a combination of these thicknesses is used for the multi-layered dielectric film F of the front facet, the theoretical dependence of the reflectivity on the wavelength is shown in FIG. 2(a), which indicates that the reflectivity is about 5% at a laser oscillation wavelength of 7800 Å. The above-mentioned combination of thicknesses is only one example, and other combinations can, of course, provide the same reflectivity as mentioned above.

Figure 2B:
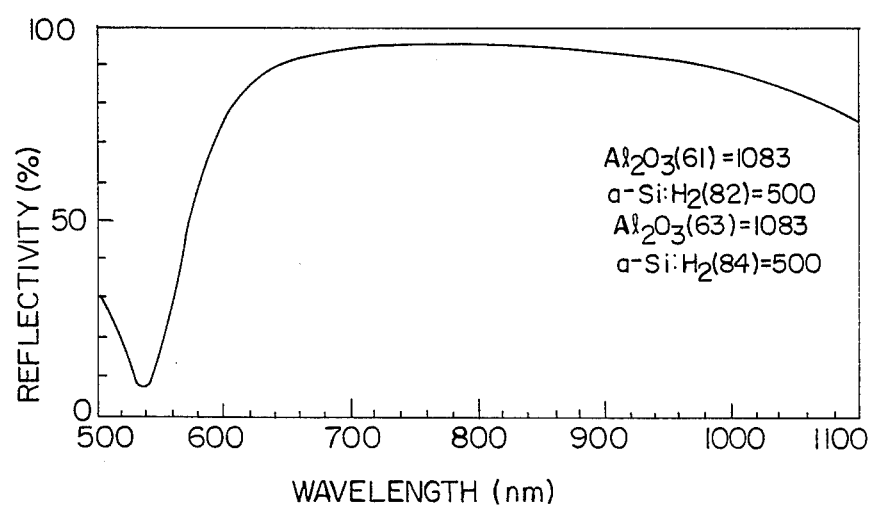
FIG. 2(b) illustrates characteristic curves showing the relationship between the wavelength of a multi-layered dielectric film on the back facet and the reflectivity of the dielectric film.

On the other hand, if the calculated reflectivity of the multi-layered dielectric film B of the back facet is to be set at about 95%, the thickness of each of the Al$_2$O$_3$ dielectric film 61, the a-Si:H$_2$ dielectric film 82, the Al$_2$O$_3$ dielectric film 63, and the a-Si:H$_2$ dielectric film 84 could be $\lambda/4n$. In this case, the theoretical dependence of the reflectivity on the wavelength is shown in FIG. 2(b).

The front facet and the back facet were covered with the multi-layered dielectric films F and B with the above-mentioned thicknesses, respectively, and the resulting reflectively of the multi-layered dielectric film F of the front facet was 7% and the resulting reflectivity of the multi-layered dielectric film B of the back facet was 94%, which are close to the calculated reflectivities discussed above. According to this invention, the multi-layered dielectric film with which covers at least one of the facets 2 and 5 is required to be a light-permeable film with a reflectivity of 30% or less.

Figure 3:
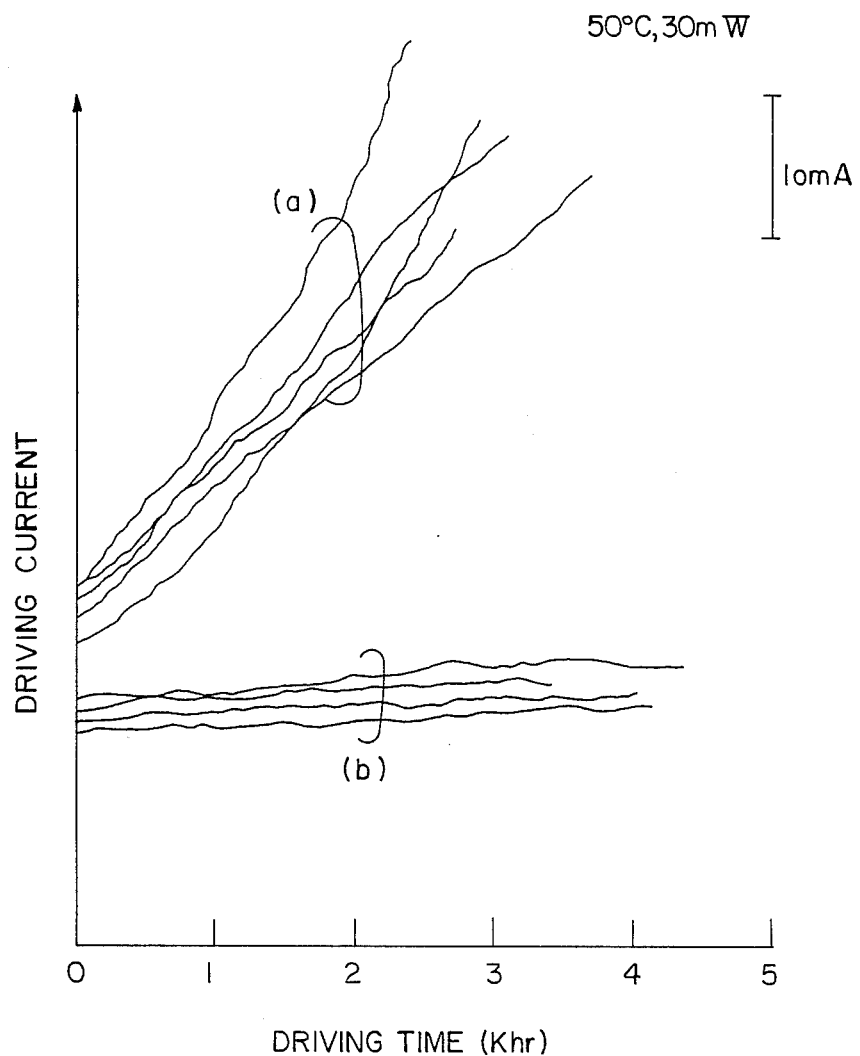
FIG. 3 illustrates characteristic curves showing the relationship between the driving time and the driving current.

In order to examine the life span of this semiconductor laser device, accelerated life tests were carried out at an atmospheric temperature of 50°60 C. on the semiconductor laser device with the optical output fixed at 30 mW. The driving current was maintained at a constant level, as shown by curves (b) in FIG. 3, which indicates that the multi-layered dielectric film F covering the front facet 2 therewith suppresses oxidation of the front facet 2 over a long period of time. Even when the optical output was fixed at 50 mW, the driving current was also maintained at a constant level.

Occurrence of damage to the semiconductor laser devices according to this invention can be reduced to half or less, compared to that of damage to conventional semiconductor laser devices having a single-layer dielectric film of Al$_2$O$_3$ with a thickness of $\lambda/4n$ on the front facet, so that the life span of the semiconductor laser devices according to this invention can be lengthened.

The above-mentioned example discloses covering the facets with multi-layered dielectric films by sputtering deposition, but it is not limited thereto. Other vapor depositions such as electron-beam vapor deposition, plasma chemical vapor deposition, etc., can also be adopted to cover the facets with the multi-layered dielectric films. Moreover, the Si of the fourth dielectric film 84 for the back facet can be protected by an additional Al$_2$O$_3$ film having a thickness of $\lambda/2n$. This invention is, of course, applicable to not only high output power semiconductor lasers but also low output power semiconductor lasers, and also is, of course, applicable to semiconductor lasers other than GaAlAs semiconductor lasers.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. In a semiconductor laser device with a protective film on both the light-emitting facet and the other facet opposed to the light-emitting facet, said protective film is made of a multi-layered dielectric film composed of alternative layers consisting of at least two kinds of dielectric film, one of which is a first dielectric film of low refractive index and the other of which is a second dielectric film of high refractive index, the kind of the film which is closest to the facet being the first dielectric film, and the thickness of each layer of said multi-layered dielectric film which covers the light-emitting facet therewith being selected so as to provide a reflectivity of 30% or less to said multi-layered dielectric film which covers the light-emitting facet.

2. A semiconductor laser device with a protective film on the facets according to claim 1, wherein the first dielectric film is made of Al$_2$O$_3$ and the second dielectric film is made of a-Si:H$_2$.

3. A semiconductor laser device with a protective film on the facets according to claim 1, wherein said protective film on said light-emitting facet comprises a 2650 A Al$_2$O$_3$ layer adjacent to said light-emitting facet, a 100 A a-Si:H$_2$ layer adjacent to said 2650 A Al$_2$O$_3$ layer, and a 2167 A layer adjacent to said 100 A a-Si:H$_2$ layer.

* * * * *